United States Patent [19]
Ohishi

[11] Patent Number: 5,926,774
[45] Date of Patent: Jul. 20, 1999

[54] TEST SYSTEM FOR TESTING THE QUALITY OF SEMICONDUCTOR PARTS AND HANDLING THE COLLECTION OF OPERATION STATUS DATA ON THE TESTER AND HANDLERS

[75] Inventor: Akira Ohishi, Tokyo, Japan

[73] Assignee: Oki Electric Industry Co., Ltd., Tokyo, Japan

[21] Appl. No.: 08/925,051

[22] Filed: Sep. 8, 1997

[30] Foreign Application Priority Data

Dec. 10, 1996 [JP] Japan .................................. 8-346766

[51] Int. Cl.⁶ .................................................. G01R 31/00
[52] U.S. Cl. .................... 702/113; 702/125; 364/478.01; 364/488; 364/468.28
[58] Field of Search .................................. 702/113, 125, 702/127; 324/754, 760, 755; 414/403, 797.5, 416; 364/488, 468.28, 478.01

[56] References Cited

U.S. PATENT DOCUMENTS 5,355,320  10/1994  Erjavic et al. .......................... 364/488

FOREIGN PATENT DOCUMENTS 6-120316  4/1994  Japan .
7-134163  5/1995  Japan .
8-114646  5/1996  Japan .

*Primary Examiner*—Kamini Shah
*Attorney, Agent, or Firm*—Wenderoth, Lind & Ponack, L.L.P.

[57] ABSTRACT

A test system testing whether test objects, such as semiconductor parts, are good or bad collects operation status data to increase the operation rate of the tester testing the test objects and the handlers handling the test objects. The relay device to which the handlers and the tester are connected, collect operation status data from them, makes a count of test objects, and sends the data and the count to the server device and the storage device. Based on the collected data and count, the server device calculates the operation time of the handlers and the tester necessary or testing a unit of test objects. The next time the test is made, the handler references the operation time to search for the optimum combination of the handlers and the tester.

28 Claims, 4 Drawing Sheets

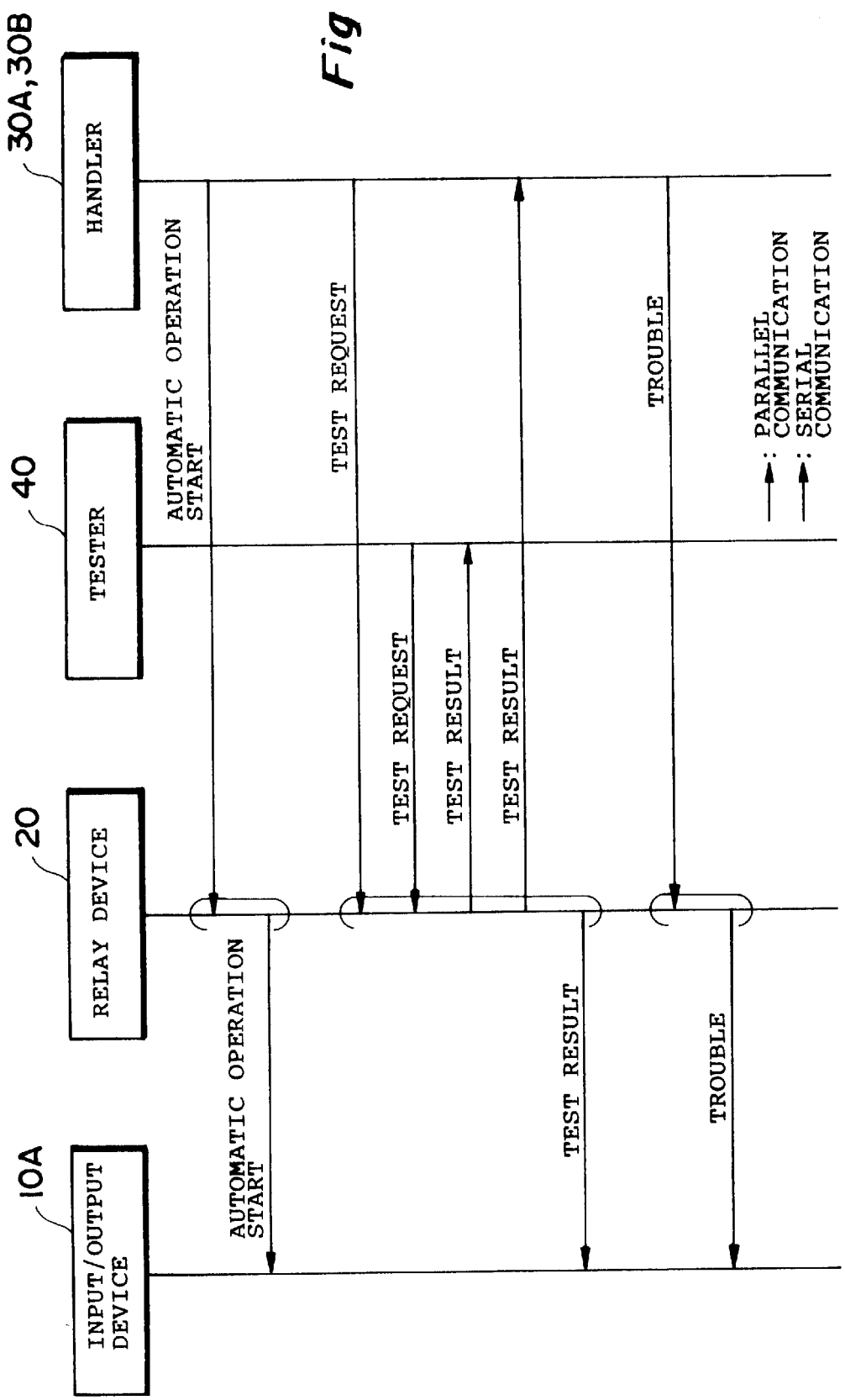

Fig. 3

| EVENT NO. | TIMESTAMP | LOT NO. | TESTER/ HANDLER NO. | EVENT CONTENTS | CODE | GENERATION TIME | END TIME | STOP TIME(sec) |
|---|---|---|---|---|---|---|---|---|
| 1 | DAY,MONTH,YEAR | #100 | TESTER 40 | PRODUCT EXCHANGE | 10 | 8:34 | 8:34 | 1 |
| 2 | DAY,MONTH,YEAR | #100 | TESTER 40 | INSTANTANEOUS STOP | 40 | 8:38 | 8:44 | 404 |
| 3 | DAY,MONTH,YEAR | #100 | HANDLER 30A | WAIT FOR INSTRUCTION | 30 | 11:29 | 11:29 | 3 |
| 4 | DAY,MONTH,YEAR | #100 | HANDLER 30B | TROUBLE | 20 | 13:18 | 13:21 | 202 |
| 5 | DAY,MONTH,YEAR | #100 | TESTER 40 | TEMPORARY STOP | 60 | 13:29 | 14:05 | 2150 |
| 6 | DAY,MONTH,YEAR | #100 | TESTER 40 | LOT EXCHANGE | 50 | 14:42 | 14:42 | 9 |
| 7 | DAY,MONTH,YEAR |  | TESTER 40 | LOT EXCHANGE | 50 | 14:42 | 14:47 | 279 |
| 8 | DAY,MONTH,YEAR | #101 | TESTER 40 | LOT EXCHANGE | 50 | 14:48 | 14:49 | 3 |
| 9 | DAY,MONTH,YEAR | #101 | TESTER 40 | INSTANTANEOUS STOP | 40 | 15:38 | 15:38 | 7 |
| 10 | DAY,MONTH,YEAR | #101 | HANDLER 30A | WAIT FOR INSTRUCTION | | | | |
| 11 | DAY,MONTH,YEAR | #101 | TESTER 40 | INSTANTANEOUS STOP | | | | |
| 12 | DAY,MONTH,YEAR | #101 | HANDLER 30B | | | | | |
| 13 | | | | | | | | |

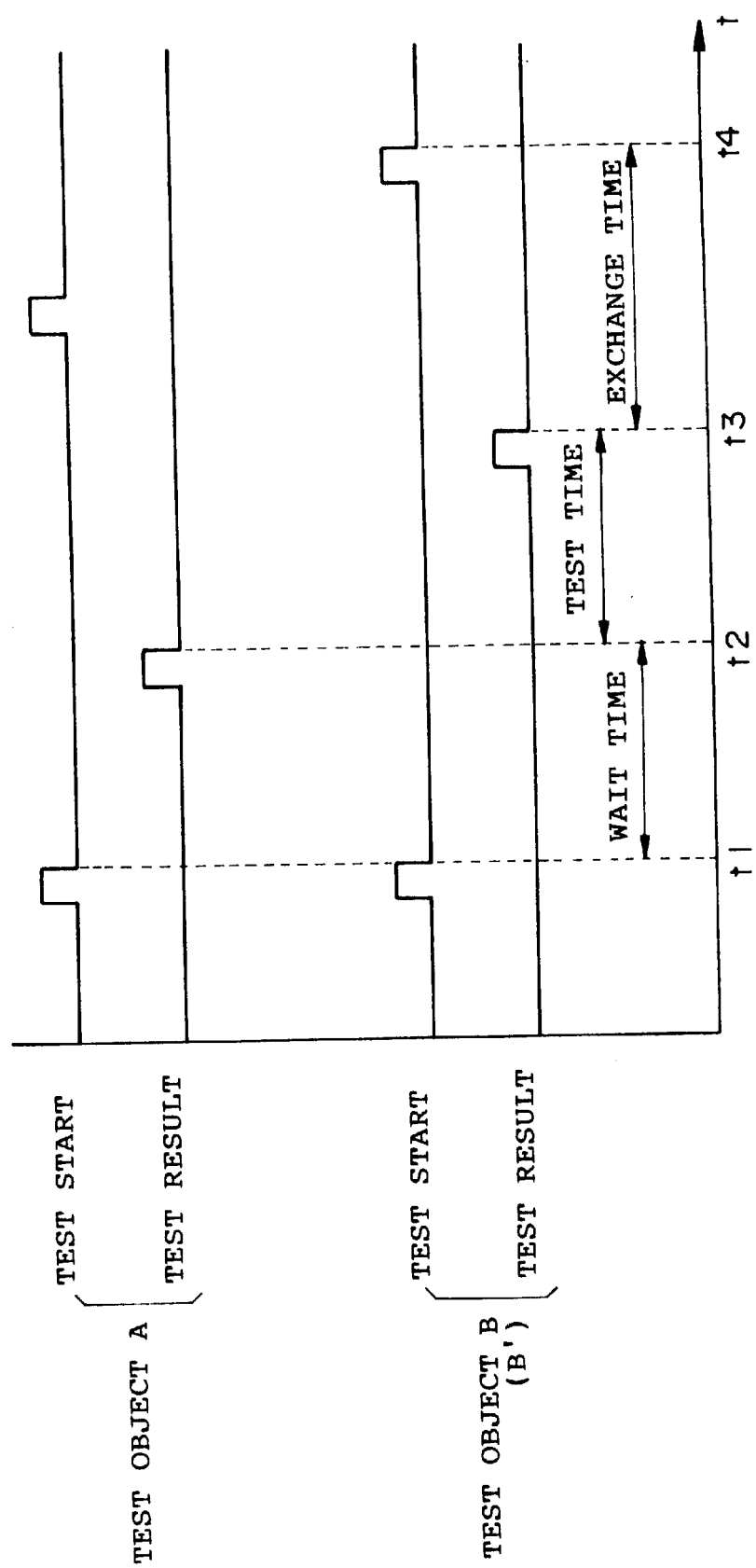

5,926,774

TEST SYSTEM FOR TESTING THE QUALITY OF SEMICONDUCTOR PARTS AND HANDLING THE COLLECTION OF OPERATION STATUS DATA ON THE TESTER AND HANDLERS

BACKGROUND OF THE INVENTION

1. Field of the Invention

The present invention relates to a test system including a tester for testing the quality of manufactured semiconductor parts and a plurality of handlers for carrying semiconductor parts into, or carrying them out from, the tester, and more particularly to the collection of operation status data on the tester and the handlers.

2. Prior Art

Conventionally, a test has been made in an IC or LSI parts factory to see if manufactured semiconductor parts satisfy the specified characteristics. In this test process, a test system has been used which includes two types of components: one is a tester for measuring the characteristics of semiconductor parts under a specified test condition (e.g., input voltage, ambient temperature, operating frequency) and the other is a handler for carrying semiconductor parts into, and carrying them out from, a test position so that the tester can test them. To meet the need for testing various types of semiconductor parts and for performing various types of tests, a variety of testers and handlers are provided. And, depending upon the semiconductor part to be tested and test items to be used in the test, a specific combination of a tester and handlers is used.

In general, the tester designed for various semiconductor parts is large; it is installed in a fixed location within the factory. By contrast, the handler designed for semiconductor parts which is limited, is mobile; a handler is selected according to the type of semiconductor parts to be tested or the type of test to be performed. When the test system is in operation, a plurality of appropriate handlers are connected to the tester to measure the characteristics and performance of the semiconductor parts to be tested.

To improve the utilization of the tester and the handler, the system also collects their operation data. The next time the same semiconductor part is manufactured, collected data is used in selecting the tester and the handler best suited for testing the semiconductor part.

However, to reduce the workload on a worker responsible for collecting data, the conventional system has collected data only on the tester which most affects the utilization of the test system. In addition, it does not collect data on an operation change that occurs within a short period of time. This prevents data necessary for the optimum operation of the test system from being collected, making it difficult for the tester and handler to further increase the operation.

SUMMARY OF THE INVENTION

To solve the above mentioned problems, a test system according to the present invention collects operation status data from the tester testing a test object and the handlers handling the test object so that the tester can test the test object, makes a count of test objects, stores the status data and the count, and calculates the operation time necessary for the tester and handlers for testing a unit of test objects.

The next time the same type of test object is tested, this system searches for a combination of the tester and handlers equivalent in efficiency to a combination of the tester and handlers used in the past in testing the same type of test object and finds the most suitable combination. This results in the test time being less than that spent in the past test, ensuring the tester and handler operation efficiency.

BRIEF DESCRIPTION OF THE DRAWINGS

The present invention will be understood more fully from the detailed description and the accompanying drawings below of the preferred embodiments of the invention.

In the drawings:

FIG. 2 is a diagram showing the procedure for communicating among devices.

FIG. 3 is a diagram showing the operating status of a tester and a handler.

FIG. 4 is a timing chart showing the processing time of tester which has several stations.

DESCRIPTION OF THE PREFERRED EMBODIMENTS

Figure 1:
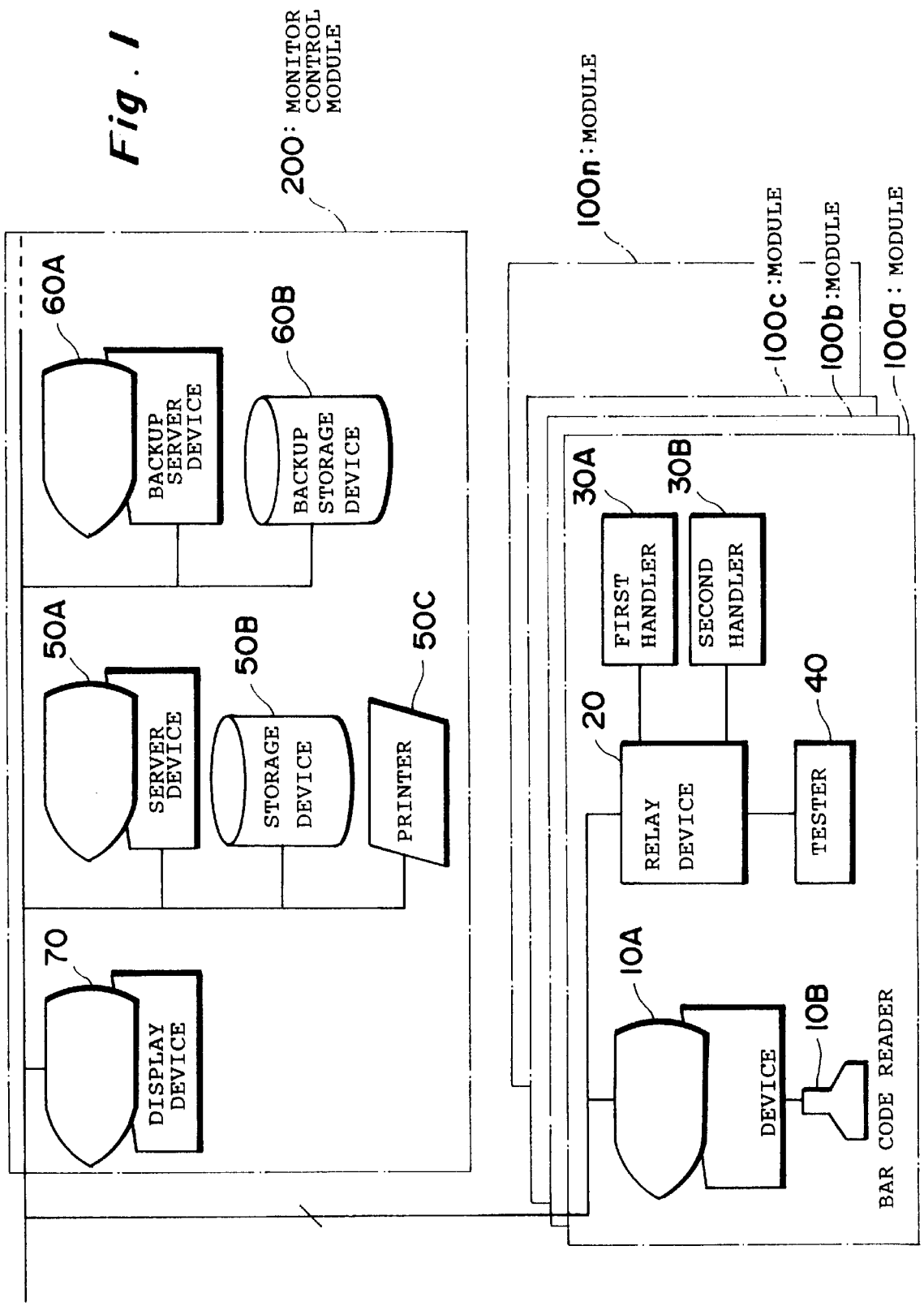
FIG. 1 is a block diagram of the test system used in the embodiment.

The following explains an embodiment of a test system according to the present invention.

FIG. 1 is a block diagram of a test system according to the present invention. This test system is installed in a factory manufacturing semiconductors such as ICs or LSIs and is for use in the final test process of test objects. It is composed primarily of a plurality of modules for testing test objects and a monitor control module for monitoring and controlling the whole system, thus forming a network on the whole.

Each of a plurality of modules 100a–100n includes a device 10A, a bar code reader 10B, a relay device 20, a first handler 30A and a second handler 30B and a tester 40. The device 10A receives data (e.g., test object type, lot number, test condition) necessary for performing a test on test objects such as ICs or LSIs and displays data received from a relay device 20. The bar code reader 10B makes data entry easier. The relay device 20 (operating as a collection means) collects data regarding the test result and the operating status of test objects from the handler 30A, hander 30B,and tester 40. The first hander 30A and the second hander 30B carry in, mount, dismount, and carry out test objects so that the tester 40 can measure the characteristics of the tester objects. The test 40 measures the characteristics of test objects under the specified test condition.

The monitor control module 200 includes a server device 50A which performs the overall monitoring and control of the whole system; a storage device 50B which contains data entered from the device 10A, test result data on test objects sent from the relay device 20, and operating status data on the handlers 30A, 30B, and tester 40; a printer 50C which prints processing results produced by the server device 50A; a backup server device 60A and a backup storage device 60B which act as alternate devices for the server device 50A and storage device 50B respectively to ensure fault tolerance; and a display device 70 which displays processing results sent from the server device 50A or data stored in the storage device 50B.

FIG. 2 shows the procedure for communication among the devices within a module. The relay device 20, the key module in each of modules 100a–100n for communication both with the monitor control module 200 and among the devices in the module, relays processing instructions, processing results, and error data to or from the first handler 30A, second handler 30B, tester 40, and device 10A. In addition, the relay device 20 sends or receives test result data regarding test objects, operating status data regarding the devices within the module, and device monitor and control information to or from the monitor control module 200.

The handler 30A and the handler 30B each have their own identification numbers to uniquely identify themselves. The DIP switch or the parallel connector in each of the handler 30A and the handler 30B is used to set up the identification number. To prevent the identification number of a handler from duplicating with that of another, the server device 50A manages the correspondence between handlers and identification numbers.

To allow the relay device 20 to know easily and reliably whether or not the handler 30A and/or handler 30B are connected to the relay device 20, a parallel-interface-based current loop is used as the interface between the relay device 20 and the handler 30A and/or the handler 30B. Although a little bit complex, a serial interface implemented through serial communication may also be used as the interface.

To enable the relay device 20 to know the connection status of the handlers 30A and 30B and, at the same time, their identification numbers, it is desirable that parallel connectors be used to set up the identification number of the handlers 30 and that a parallel interface be used between the relay device 20 and the handlers 30. This configuration allows the relay device 20 to check the loopback laid between the relay device 20 and each of the connected handlers 30, more specifically, to check which terminal is closed (the current is active) or open (the current is not active), thus giving the relay device 20 information as to whether or not the handlers are connected as well as their identification numbers. Conversely, when a connected handler 30 which has been powered on is disconnected from the relay device 20 or is powered off and all the terminals are open, the relay device 20 knows that the handler 30 is disconnected or the power is turned off.

When the handler 30A or handler 30B is disconnected or when the power is off, the operator inputs a reason or a cause in the input/output device 10A to exactly grasp the operation status for each handler.

The relay device 20 outputs the connection status information and identification numbers, obtained as described above, to the server device 50A; it also outputs operation information of the handler 30A, handler 30B, and tester 40 to the server device 50A.

FIG. 3 shows operation status data of the handlers and the tester. As shown in this figure, data of event management numbers, event occurrence time-stamps, test object lot numbers, tester/handler identification numbers, event contents, and event code numbers is sent from the relay device 20 to the server device 50A in real time. Based on the data, the server device 50A references identification numbers to identify the operating status of each device. The data is stored in the storage device 50B.

FIG. 3 does not show the handler operation time and the handler non-operation time. However, these two times may be clearly distinguished if the server device 50A assigns a period of time, during which the handler 30A or the handler 30B is not connected, as the handler non-operation time.

FIG. 4 is a timing chart showing the processing times of test objects. The relay device 20 (operating as a collection means) collects information on the time during which each of the handler 30A, second handler 30B, and tester 40 processes a test object. More specifically, the relay device 20 receives the operation start trigger pulse and the operation end trigger pulse from each of the handler 30A, handler 30b, and tester 40. And, for the test object A which is handled by the first handler 30A and the test object B (B') which is handled by the second handler 30B, the relay device 20 (operating as a calculation means) uses the trigger pulse reception times to calculate the following three times: the time (t1–t2) during which the test object B waits to be tested by the tester 40, the test time (t2–t3) during which the test object B is tested by the tester 40, and the exchange time (t3–t4) during which the test object B is exchanged with some other test object B'. The relay device 20 then sends the calculation results to the server device 50A.

The wait time, test time, and exchange time, described above, allow the system to evaluate the operation status of the handler 30A, handler 30B, or tester not only for the time during which each device is turned on; instead, the system evaluates the operation status using the time during which each device actually handles and tests a test object. This method gives the system more exact operation status data for the handler 30A, handler 30B, and tester 40.

The relay device 20 also counts the number of test objects while calculating the times, and sends the count to the server device 50A.

As described above, the relay device 20 outputs to the server device 50A and the storage device 50B various types of data such as the test result and the number of test objects, the connection status (operation status) of the handlers 30A and 30B, the wait time, test time, and exchange time of the handlers 30A and 30B and tester 40. The server device 50A performs calculation on the data stored in the storage device 50B.

The server device 50A calculates the monthly and weekly operation time total for each device, calculates the contents of events for each lot, or calculates the total time required to test each unit of test objects. The display device 70 accesses the server device 50A to get the calculation result and displays it.

The server device 50A stores into the storage device 50B the test history data for the test objects tested in the past. This history data includes the operation times required by the handlers 30A and 30B and the tester 40 to test a unit of test objects for each lot as well as the identification numbers of the handlers 30A and 30B and tester 40 used in the test. When the same type of test object is tested, the system refers to the test history data to search for the best combination of the handlers 30A and 30B and the tester 40, or for the best combination of the handlers 30C and 30D and the tester 40' (not shown in the figure), for testing the object. This reduces the operation time required by the handler 30A and the tester 40 to test a unit of test objects, thus enabling the same type of test to be completed in less time.

The relay device 20 (operating as a computation means) not only measures the characteristics of test objects but also counts the numbers of good test objects and bad test objects. More specifically, it counts the number of good test objects, bad test objects, re-tested test objects, and the total number of test objects. The relay device 20 outputs these numbers to the server device 50A and the storage device 50B.

The number of bad test objects includes not only bad test objects but also those objects which are bad because of faulty tools, such as faulty IC sockets or probes, on the handlers 30A and 30B and tester 40. Therefore, if the bad object ratio is higher than a pre-defined ratio (predefined by the server device 50A operating as a setting means), a re-test must be made to identify the real cause. To determine whether to make a re-test, the server device 50A (operating as a determination means) uses the numbers received from the relay device 20 and a ratio pre-defined for each test object type or for each test object lot. The server device 50A compares the bad object ratio received from the relay device 20 with a pre-defined ratio, making it possible to determine whether to make a test, precisely and speedily.

Note that, when the re-test must be made, the system reads the test condition information from the storage device 50B (operating as accumulation means) instead of the user re-inputting the test condition in the input/output device 10A. This eliminates cumbersome data re-input and sets up the re-test condition smoothly and correctly.

The above mentioned tools on the handlers 30 and tester 40 may cause electrical contact problems or mechanical malfunctions after long use. To reduce the number of test objects determined as bad because of aged tools, it is desirable that long-used tools be exchanged before problems develop. For this purpose, the handlers 30 and tester 40 collect tool usage length and tool usage count data, and the relay device 20 sends tool type data as well as collected tool usage length and tool usage count data to the server device 50A and storage device 50B.

The storage device 50B contains specification data on the tool types and their maximum usage length and count and, upon receiving collected data from the relay device 20, updates tool usage length and count history data. The server device 50A (operating as acquisition means and judgement means) compares the specification data with the history data, both contained in the storage device 50B, and determines whether or not each tool is still usable. If the server device 50A determines that a tool can no longer be used, it sends information indicating the condition to the input/output device 10A and the display device 70 and suspends the processing until the user judges the condition.

In this way, the server device 50A compares tool durability specification data with tool usage history data to determine if the tool is still usable, allowing the user to make a correct decision. As a result, this prevents a tool exceeding the maximum tool usage length or count from being used.

When the handlers 30 and the tester 40 re-test a test object, they collect the tool usage length and count data again. Therefore, data collected during the re-test, which may also be used in determining whether the tool is usable, helps make a correct judgment.

What is claimed is:

1. A test system for use in testing test objects, said system comprising:

test means for testing the test objects to judge a quality of the test objects;

handling means for supplying the test objects to, and for removing the test objects from, said test means;

setting means for setting a quality yield of the test objects to be judged by said test means, wherein the quality yield represents an acceptable yield of tested test objects having a satisfactory quality;

computation means for computing an actual yield of the test objects which have been actually judged to have a satisfactory quality by said test means; and determination means for determining whether or not a test object must be re-tested by comparing the quality yield with the actual yield.

2. A test system as set forth in claim 1, further comprising accumulation means for storing conditions of said test means for testing the test objects, wherein said test means is operable to read out the conditions from said accumulation means to re-test the test object.

3. A test system as set forth in claim 1, further comprising:

count means for counting the test objects;

collection means for collecting operation status data with respect to an operation status of said test means and said handling means, the operation status data including a wait time during which the test objects wait to be tested by said test means, a test time during which the test objects are tested by said test means, and an exchange time during which the test objects are supplied and removed by said handling means; and calculation means for calculating time of operation of said test means and said handling means necessary for testing one test object, based on the operation status data collected by said collection means, to provide the most suitable combination of said test means and said handling means.

4. A test system for use in testing test objects with parts used to test the test objects, said system comprising;

test means for testing the test objects to judge the quality of the test objects;

handling means for supplying the test objects to, and for removing the test objects from, said test means;

memory means for storing durability specification data for the parts used to test the test objects;

acquisition means for acquiring usage history data for the parts; and judgement means for judging whether or not each of the parts is usable by comparing the durability specification data with the usage history data for the parts.

5. A test system as set forth in claim 4, further comprising acquisition means for acquiring usage history data which includes usage status data for the parts used when a test object is re-tested.

6. A test system as set forth in claim 4, further comprising:

count means for counting the test objects;

collection means for collecting operation status data with respect to an operation status of said test means and said handling means, the operation status data including a wait time during which the test objects wait to be tested by said test means, a test time during which the test objects are tested by said test means, and an exchange time during which the test objects are supplied and removed by said handling means; and calculation means for calculating time of operation of said test means and said handling means necessary for testing one test object, based on the operation status data collected by said collection means, to provide the most suitable combination of said test means and said handling means.

7. A test system for use in testing test objects, said system comprising:

a tester operable to test the test objects to judge a quality of the test objects;

a handler operable to supply the test objects to, and to remove the test objects from, said tester;

a relay device operably associated with said tester and said handler such that said relay device is operable to communicate information with said tester and said relay device, said relay device being operable to compute an actual yield of the test objects which have been actually judged to have a satisfactory quality by said tester;

a server device operably associated with said relay device such that said server device is operable to communicate information with said relay device, said server device being operable to set a quality yield of the test objects to be judged by said tester, wherein the quality yield represents an acceptable yield of tested test objects having a satisfactory quality, and to determine whether or not a test object must be re-tested by comparing the quality yield with the actual yield.

8. A test system as claimed in claim 7, further comprising:

a storage device operably associated with said server device such that said server device is operable to communicate information with said storage device, said storage device being operable to store conditions of said tester for testing the test objects, wherein said tester is operable to read out the conditions from said storage device to re-test the test objects.

9. A test system as claim in claim 7, wherein:

said relay device is further operable to collect operation status data with respect to said tester and said handler, the operation status data includes a wait time during which the test objects wait to be tested by said tester, a test time during which the test objects are tested by said tester, and an exchange time during which the test objects are supplied and removed by said handler; and said server device is further operable to calculate a time of operation of said tester and said handler necessary for testing one test object based on the operation status data collected by said relay device to provide the most suitable combination of said tester and said handler.

10. A test system for use in testing test objects with parts used to test the test objects, said system comprising:

a tester operable to test the test objects to judge a quality of the test objects;

a handler operable to supply the test objects to, and to remove the test objects from, said tester;

a server device operably associated with said handler and tester such that said server device is operable to communicate information with said handler and tester; and a storage device operably associated with said server device such that said server device is operable to communicate information with said storage device, said storage device being operable to store durability specification data for the parts used to test the test objects;

wherein said server is operable to judge whether or not each of the parts is usable by comparing the durability specification data with usage history data for the parts.

11. A test system as claimed in claim 10, wherein said server device is operable to acquire usage history data which includes usage status data for the parts used when a test object is retested.

12. A test system as claim in claim 10, wherein:

said relay device is further operable to collect operation status data with respect to said tester and said handler, the operation status data including a wait time during which the test objects wait to be tested by said tester, a test time during which the test objects are tested by said tester, and an exchange time during which the test objects are supplied and removed by said handler; and said server device is further operable to calculate a time of operation of said tester and said handler necessary for testing one test object, based on the operation status data collected by said relay device, to provide the most suitable combination of said tester and said handler.

13. A test system for use in testing test objects, said system comprising:

a test means for measuring a characteristic of the test objects under a specified test condition;

a handling means for supplying the test objects to, and for removing the test objects from, said test means;

a relay device for collecting data regarding a test result from said test means for each of the test objects and for collecting corresponding data regarding an operating status of said handling means and said test means with respect to each of the test objects from said handling means and said test means, respectively, when said handling means and said test means operate on each of the test objects, respectively;

a server device for monitoring and controlling said test system; and a storage device for storing the data regarding the test result for each of the test objects and the corresponding data regarding the operating status of said handling means and said test means with respect to each of the test objects collected by said relay device.

14. A test system as claimed in claim 13, wherein said test means is further operable for receiving data necessary for performing a test and for displaying data received from said relay device.

15. A test system as claimed in claim 13, wherein said handling means is further operable for mounting the test objects on said test means and for dismounting the test objects from said test means.

16. A test system as claimed in claim 13, wherein:

said handing means comprises a plurality of handlers, each of said plurality of handlers having a respective identification number, and each being operable for outputting the respective identification number to uniquely identify said each of said plurality of handlers; and said server device is operable for managing a correspondence between said each said plurality of handlers and the respective identification numbers.

17. A test system as claimed in claim 16, wherein:

said relay device is operable for receiving the identification numbers from said plurality of handlers, for checking which of said plurality of handlers is operational, and for outputting status information and received identification numbers to said server device.

18. A test system as claimed in claim 16, wherein said relay device is operable for one or more of sending event management numbers, event occurrence time-stamps, test object lot numbers, tester/handler identification numbers, event contents, and event code numbers to said server device in real time.

19. A test system as claimed in claim 16, wherein said relay device is operable for collecting information regarding a time period during which each of said plurality of handlers and said test means processes the test object.

20. A test system as claimed in claim 16, wherein said server device is operable for storing into said storage device a test history for the test objects tested in the past, including operation times required by said plurality of handlers and said tester and identification numbers of said plurality of handlers and said test means.

21. A test system as claimed in claim 20, wherein said server device is further operable for determining a best combination of said plurality of handlers and said test means for the test objects based on the test history for the test objects tested in the past.

22. A test system as claimed in claim 13, wherein said server device is operable for storing into said storage device a test history for the test objects tested in the past.

23. A test system as claimed in claim 13, wherein said relay device is further operable for calculating a wait time during which a particular test object waits to be tested by said test means, a test time during which the particular test object is tested by said test means, and an exchange time during which the particular test object is exchanged with another particular test object by said handling means.

24. A test system as claimed in claim 13 for further use with tools for testing the test objects, wherein:

said handling means and said test means are operable for collecting tool usage length data and tool usage count data;

said relay device is operable for sending tool-type data, the tool usage length data, and the tool usage count data to said server device;

said storage device is operable for storing specification data of tool types, including maximum usage length and count for each of the tool types, usage length and count history data, and for updating the usage length and count history data based on the tool usage length data and tool usage count data sent by said relay device; and said server device is operable for comparing the specification data with the usage length and count history data to determine whether each tool is still usable.

25. A test system as claimed in claim 24, further comprising a display device, wherein said server device is further operable for sending information indicating that a tool is not usable to said display device, and for suspending processing.

26. A test system for use in testing test objects, said system comprising:

a test means for measuring a characteristic of the test objects under a specified test condition;

a handling means for supplying the test objects to, and for removing the test objects from, said test means;

a relay device for collecting data regarding a test result from said test means and for collecting data regarding an operating status of said handling means and said test means from said handling means and said test means, respectively;

a server device for monitoring and controlling said test system;

a storage device for storing the data regarding the test result and the data regarding the operating status of said handling means and said test means collected by said relay device;

a backup server device for monitoring and controlling said test system and for operating as a backup for said server device; and a backup storage device for storing the data regarding the test result and the data regarding the operating status of the test objects collected by said relay device and for operating as a backup for said storage device.

27. A test system for use in testing test objects, said system comprising:

a test means for measuring a characteristic of the test objects under a specified test condition;

a handling means for supplying the test objects to, and for removing the test objects from, said test means;

a relay device for collecting data regarding a test result from said test means and for collecting data regarding an operating status of said handling means and said test means from said handling means and said test means, respectively;

a server device for monitoring and controlling said test system; and a storage device for storing the data regarding the test result and the data regarding the operating status of said handling means and said test means collected by said relay device;

wherein said relay device is further operable for counting a number of total test objects, a number of good test objects which meet the specified test condition, and a number of bad test objects which do not meet the specified test condition.

28. A test system as claimed in claim 27, wherein said server device is operable for determining whether to re-test the test objects based on the number of total test objects, the number of good test objects and the number of bad test objects counted by said relay device, and a pre-defined ratio of bad test objects to total test objects.

* * * * *